US012425033B2

(12) United States Patent
Carlson

(10) Patent No.: US 12,425,033 B2
(45) Date of Patent: Sep. 23, 2025

(54) SYSTEM AND METHOD FOR REMOTE DIGITAL TIME TRANSFER

(71) Applicant: NATIONAL RESEARCH COUNCIL OF CANADA, Ottawa (CA)

(72) Inventor: Brent Carlson, Penticton (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 0 days.

(21) Appl. No.: 18/287,733

(22) PCT Filed: Apr. 26, 2022

(86) PCT No.: PCT/IB2022/053865
§ 371 (c)(1),
(2) Date: Oct. 20, 2023

(87) PCT Pub. No.: WO2022/229843
PCT Pub. Date: Nov. 3, 2022

(65) Prior Publication Data
US 2024/0195426 A1    Jun. 13, 2024

Related U.S. Application Data

(60) Provisional application No. 63/180,703, filed on Apr. 28, 2021.

(51) Int. Cl.
*H03L 7/14* (2006.01)
*H03L 7/093* (2006.01)

(52) U.S. Cl.
CPC .............. *H03L 7/146* (2013.01); *H03L 7/093* (2013.01); *H03L 2207/50* (2013.01)

(58) Field of Classification Search
CPC ...... H03L 7/146; H03L 7/093; H03L 2207/50
See application file for complete search history.

(56) References Cited

U.S. PATENT DOCUMENTS 3,751,900 A * 8/1973 Phillips .................... G04G 7/02
968/922
4,551,856 A * 11/1985 Victor .................... H03D 7/163
455/316

(Continued)

OTHER PUBLICATIONS

Replace "the phase increment signal" with "the periodically calculated and applied phase increment". (Year: 2018).*

(Continued)

*Primary Examiner* — Freshteh N Aghdam
(74) *Attorney, Agent, or Firm* — Perry + Currier Inc.

(57) ABSTRACT

Methods and systems for synchronizing at least one remote local oscillator with a central local oscillator, comprising receiving a remote local oscillator signal from at least one remote local oscillator and a master local oscillator signal from the central local oscillator and in response determining a round-trip phase measurement of temporal delay variability of the duplex real-time link between the remote station and central station, measuring frequency vs. time of the remote local oscillator signal relative to the master oscillator, adjusting the measured frequency vs. time according to the round-trip phase measurement to remove effects of temporal delay variability over the duplex real-time link telemetry, digitally filtering the measured frequency to remove variations in frequency on timescales<10× the round-trip delay and that are known not to be intrinsically due to the remote local oscillator, generating a phase increment signal from the filtered measured frequency, receiving and adjusting the local oscillator signal according to the phase increment signal and in response generating a derived digital domain clock signal that tracks the master local oscillator signal and converting the derived digital domain clock signal to an ultra-low phase-noise time domain voltage clock signal.

12 Claims, 3 Drawing Sheets

(56) References Cited

U.S. PATENT DOCUMENTS

| | | | |
|---|---|---|---|
| 4,669,051 A * | 5/1987 | Barr, IV | G01R 27/30 |
| | | | 702/191 |
| 5,673,133 A * | 9/1997 | Imaoka | H04L 7/0075 |
| | | | 356/73.1 |
| 7,557,661 B1 | 7/2009 | Melanson et al. | |
| 7,746,972 B1 | 6/2010 | Melanson et al. | |
| 9,860,054 B1 | 1/2018 | Bradley | |
| 10,868,550 B2 | 12/2020 | Janardhanan et al. | |
| 2002/0130725 A1 | 9/2002 | Han | |
| 2006/0056560 A1 * | 3/2006 | Aweya | H04J 3/0664 |
| | | | 375/356 |
| 2016/0352505 A1 | 12/2016 | Huang | |

OTHER PUBLICATIONS

PCT/IB2022/053865, System and Method for Remote Digital Time Transfer, Apr. 26, 2022.

PCT/IB2022/053867, Digital Clean Up Oscillator, Apr. 26, 2022.

U.S. Appl. No. 18/287,746, Digital Clean Up Oscillator, filed Oct. 20, 2023.

Carlson, B. R. "Incoherent clocking in coherent radio interferometers." Electronics Letters 54.14 (2018): 909-911.

Levine, Judah. "An algorithm for synchronizing a clock when the data are received over a network with an unstable delay." IEEE transactions on ultrasonics, ferroelectrics, and frequency control 63.4 (2015): 561-570.

\* cited by examiner

SYSTEM AND METHOD FOR REMOTE DIGITAL TIME TRANSFER

FIELD OF THE INVENTION

The present disclosure generally relates to electronic communication methods and systems. More particularly, examples of the disclosure relate to a system and method for synchronizing oscillators using remote digital time transfer.

BACKGROUND OF THE DISCLOSURE

Electronic communication methods and systems allow synchronisation between electronic devices. For example, radio interferometer arrays require precise and predictable real-time synchronisation of each array element to a common reference, such as a central local oscillator (LO) source.

Specialized photonics round-trip LO (Local Oscillator) distribution methods are known wherein feedback is provided from a remote station to "steer" the remote clock and keep it phase-locked to the central station LO. However, for a given required clock frequency, as the distance between the stations increases, the phase-locked loop bandwidth drops and unacceptable phase noise of the remote clock ensues. This problem becomes worse as the required clock frequency at the remote station increases.

Accordingly, a problem exists with respect to precision ultra-low phase noise clock and time transfer across long distances.

The following prior art is relevant to this description: Carlson, B., *Incoherent clocking in coherent radio interferometers*, IEEE Electronics Letters, May 2018.

Any discussion of problems provided in this section has been included in this disclosure solely for the purposes of providing a background for the present invention, and should not be taken as an admission that any or all of the discussion was known at the time the invention was made.

BRIEF DESCRIPTION OF THE DRAWING FIGURES

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements and wherein:

Figure 1:
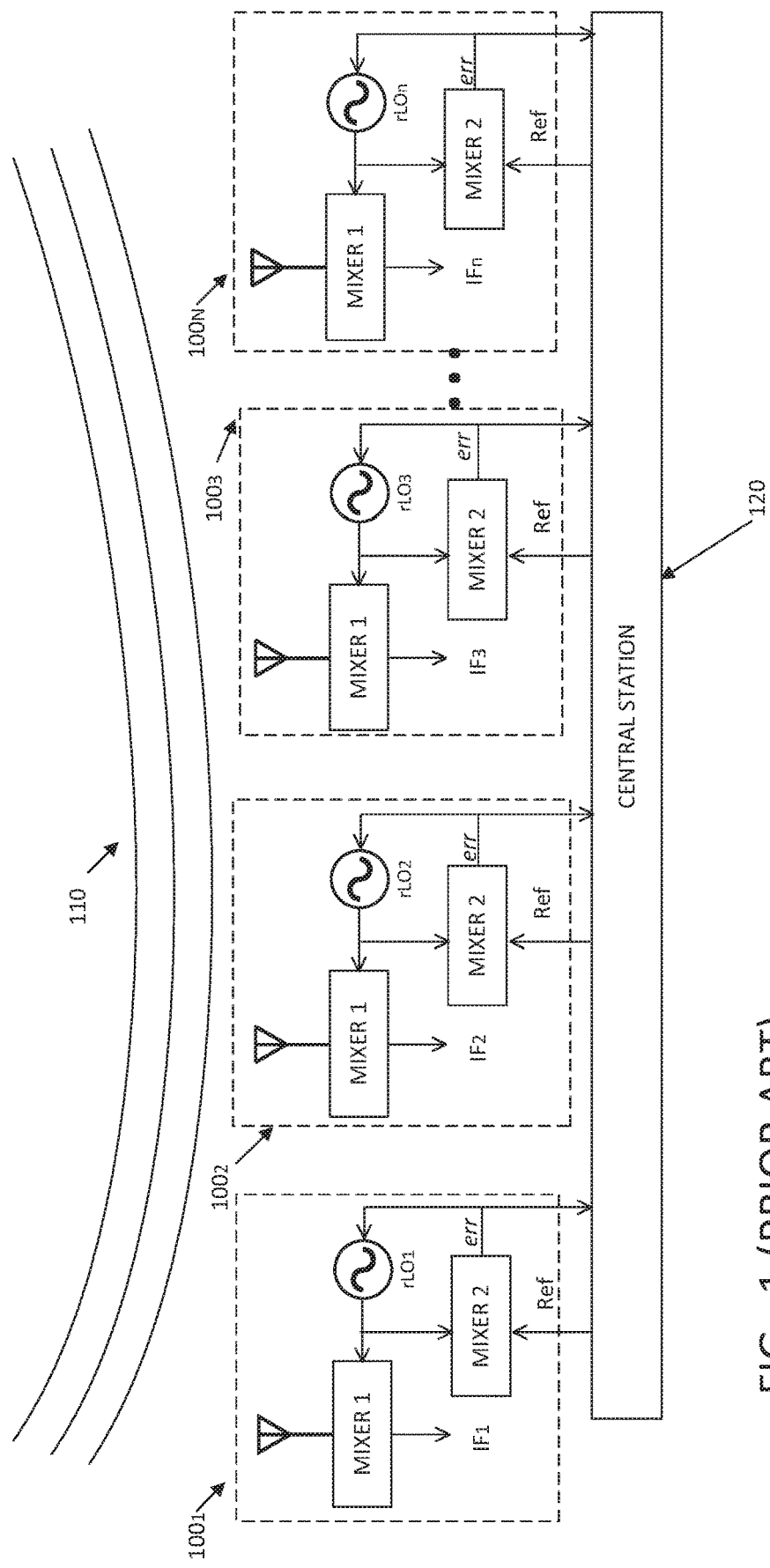
FIG. 1 illustrates an array of remote stations for coherently sampling an incoming wavefront in accordance with the prior art.

It will be appreciated that elements in the figures are illustrated for simplicity and clarity and have not necessarily been drawn to scale. For example, the dimensions of some of the elements in the figures may be exaggerated relative to other elements to help to improve understanding of illustrated embodiments of the present disclosure.

DETAILED DESCRIPTION OF EXEMPLARY EMBODIMENTS

The description of exemplary embodiments of the present disclosure provided below is merely exemplary and is intended for purposes of illustration only; the following description is not intended to limit the scope of the invention disclosed herein. Moreover, recitation of multiple embodiments having stated features is not intended to exclude other embodiments having additional features or other embodiments incorporating different combinations of the stated features.

As set forth in more detail below, exemplary embodiments of the disclosure relate to incoherent clocking systems and methods that can be used to distribute an ultra-low phase noise clock to a remote station, phase-locked to a clock at a central station, using mostly digital methods, with little or no limitation in physical separation (i.e. distance) between the stations, and with sufficiently low phase noise relative to the central station clock for use, as examples, in heterodyne receivers operating up to 1 THz, and digitizers operating up to 100 GHz.

In an aspect of this description, there is provided a system for synchronizing at least one remote station with a central station over a duplex real-time link, comprising: a distributed incoherent clocking module for receiving a remote local oscillator signal from at least one remote station and a master local oscillator signal from the central station and in response determining a round-trip phase measurement of temporal delay variability of the duplex real-time link between the remote station and central station, measuring frequency vs. time of the remote local oscillator signal relative to the master oscillator, adjusting the measured frequency vs. time according to the round-trip phase measurement to remove effects of temporal delay variability over the duplex real-time link telemetry, and generating a phase increment signal; a direct digital synthesizer for receiving and phase adjusting the local oscillator signal according to the phase increment signal and in response generating a derived digital domain clock signal that tracks the master local oscillator signal; and a digital to time domain clock converter for converting the derived digital domain clock signal to an ultra-low phase-noise time domain voltage clock signal.

According to another aspect, there is provided a method of synchronizing at least one remote station with a central station over a duplex real-time link, comprising: transmitting a remote local oscillator signal from the remote station over the duplex real-time link; receiving the remote oscillator signal from the duplex real-time link at the central station; measuring frequency vs. time of the remote local oscillator signal relative to a central oscillator signal at the central station; determining a round-trip phase measurement of temporal delay variability of the duplex real-time link between the remote station and central station; adjusting the tracked frequency of the remote local oscillator signal according to the round-trip phase measurement to remove effects of temporal delay variability over the duplex real-time link; low-pass filtering frequency jitter from the tracked frequency on timescales less than 10× the round-trip delay over the link; converting the low-pass filtered tracked frequency vs. time measurements to a periodically calculated and applied phase increment signal; clocking a direct digital synthesizer at remote station with the remote local oscillator signal phase adjusted by the phase increment signal to generate a derived digital domain clock signal; and converting the derived digital domain clock signal to an ultra-low phase-noise time domain voltage clock signal.

Coherent instruments, such as radio telescopes, require an incoming wavefront to be coherently sampled at each station (e.g. antenna) across an array of size ranging, for example, from hundreds of meters to thousands of kilometers. This requires a clock signal at each station that is phase locked with the clock signals at all other stations.

It is known to provide a phase-locked loop (PLL) between a remote station and central station whereby the central station LO signal transmitted to the remote station is reflected back to the central station where the phase difference between the transmitted and received signals is measured and used to adjust the central station LO to compensate for low frequency variations, while any high frequency variations are removed with a jitter cleaner. However, as the distance between the remote and central stations increases the bandwidth of the PLL drops, leading to a practical maximum distance dependent on the observing frequency (e.g. the Atacama Large Millimeter/submillimeter Array (ALMA), operating at 1 THz, has maximum distance of about 15 km, while the Square Kilometer Array (SKA) mid telescope operating at 15 GHz, has maximum distance of about 80 km).

In examples set forth in this disclosure, each remote station may be provided with an independent (free running) LO that is transmitted to the central station. The frequency versus time of the remote station LO may be measured at the central station relative to the central station LO and converted to digital phase increment adjustment values that can be applied to a digital synthesizer at the remote station which, in response, phase adjusts the remote station LO to precisely track the central station LO.

Turning to FIG. 1, an array of remote stations ($100_1$, $100_2$, $100_3$, ... $100_N$) is provided for coherently sampling an incoming RF (radio frequency) signal 110 at each station across the array to generate respective sampled signals $IF_1$, $IF_2$, $IF_3$, ... $IF_N$, as is known in the prior art. The remote stations include antennas and receivers comprising mixers (MIXER 1, MIXER 2) and local oscillators (rLO) functioning as a heterodyne to downsample the RF signal 110 to a manageable intermediate frequency ($IF_1$, $IF_2$, $IF_3$, ... $IF_N$). This sampling requires that the local oscillators ($rLO_1$, $rLO_2$, $rLO_3$, $rLO_N$) at each station be phase locked with the oscillators at all other stations. To that end, a phase-locked loop (PLL) is provided between each remote station and a central station 120 whereby the rLO oscillator signal is compared with an external reference frequency (Ref) from central station 120 and sends an error signal (err) back to the rLO to keep it in phase lock with the reference signal. MIXER 2 compares the rLO oscillator signal to the reference frequency (Ref). Any error in the phase results in an error signal that is fed back to the local oscillator to adjust its frequency to maintain exact frequency tuning. Each remote station $100_1$, $100_2$, $100_3$, ... $100_N$ receives the Ref signal from the same source, central station 120, so that all remote stations are locked to the same frequency.

Within central station 120, the phase difference between the transmitted Ref signal and reflected error signal (err) is measured and used to adjust the central station Ref signal to compensate for low frequency variations while any high frequency variations are removed with a jitter cleaner. However, as discussed above, a drop in bandwidth of the PLL with increasing distance between the remote and central stations leads to a practical maximum distance.

Figure 2:
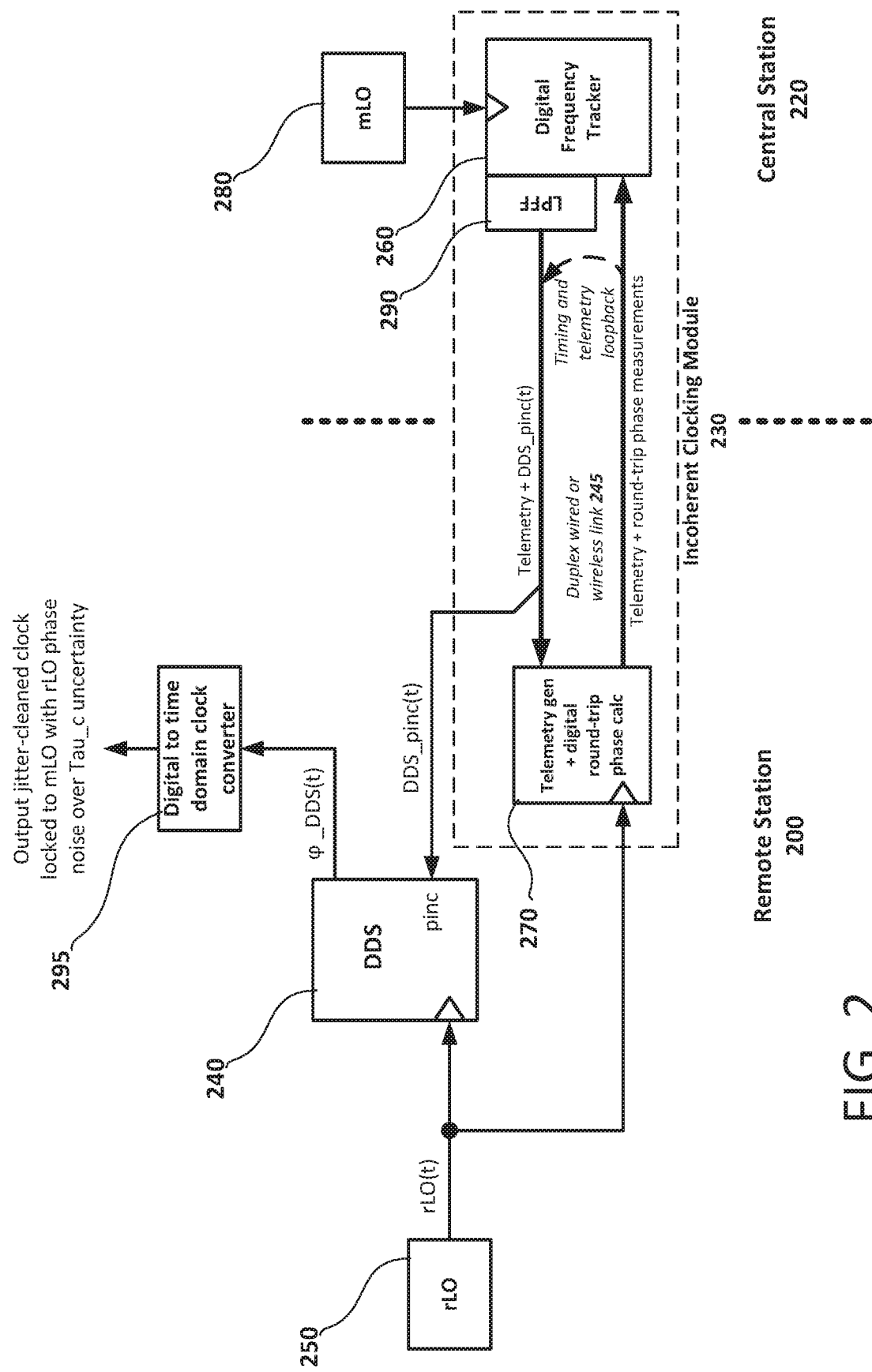
FIG. 2 illustrates a system for remote digital time transfer, in accordance with exemplary embodiments of the disclosure in greater detail.

Turning to FIG. 2, which illustrates an exemplary system for remote digital time transfer, instead of providing a phase-locked loop (PLL) between a remote station 200 and central station 220, as in the prior art, a distributed incoherent clocking module 230 sends phase increment updates (DDS_pinc(t)) to an n-bit precision direct digital synthesizer (DDS) 240 at the remote station 200 which, in response, produces an ultra-low phase noise remote clock signal ($\varphi$_DDS(t)) that is phase-locked to a central local oscillator mLO 280. As discussed below, distributed incoherent clocking module 230 includes a digital frequency tracker 260 at the central station 220, and a telemetry generator and digital round-trip phase calculator 270 at the remote stations 200, connected by a full-duplex wired or wireless link 245 (e.g. wireless or digital fiber optic).

Figure 3:
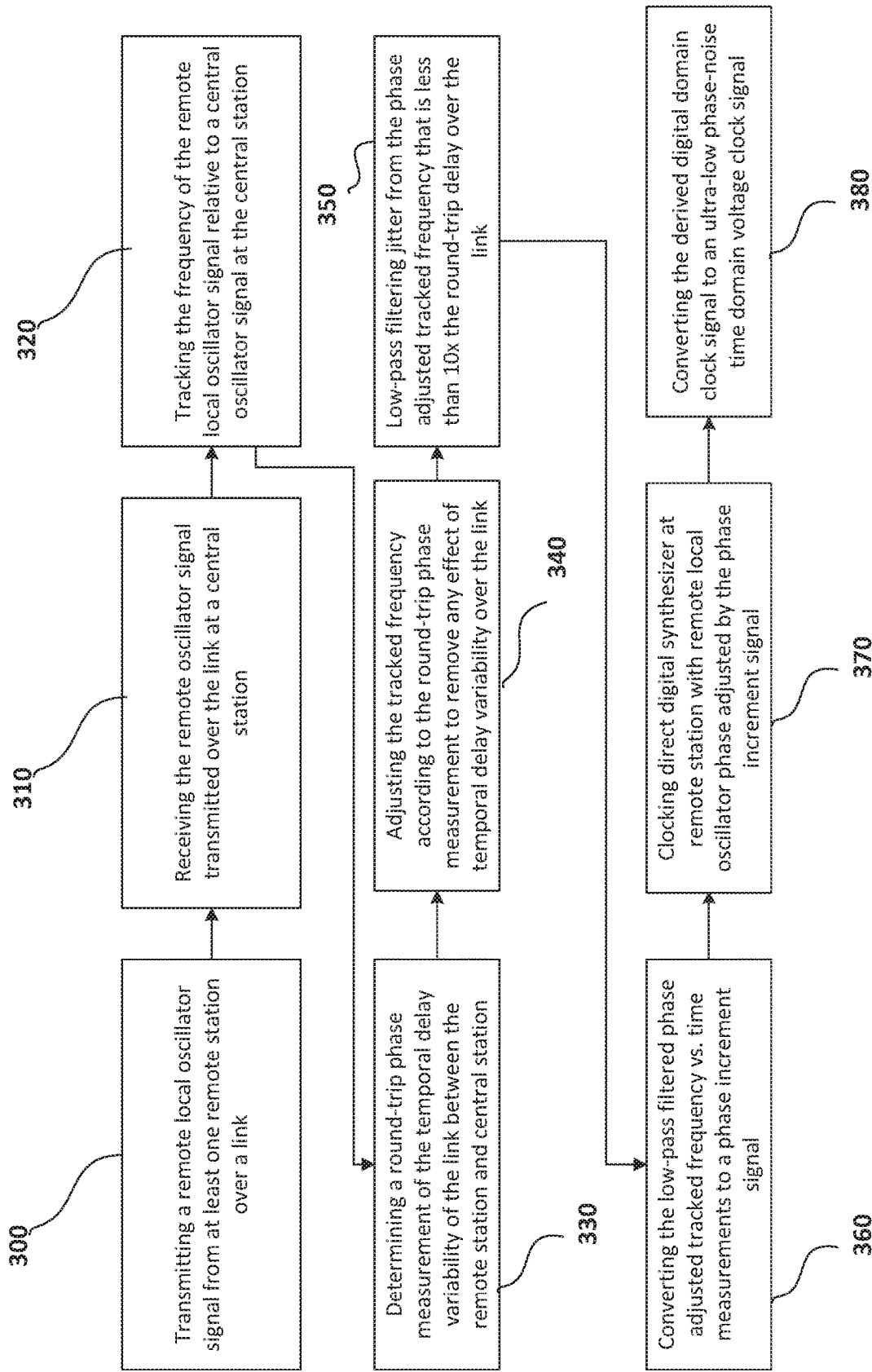
FIG. 3 is a flowchart showing an exemplary method for the system of FIG. 2.

As shown in FIG. 3, and discussed in greater detail below, a method is provided for generating the ultra-low phase noise clock signal ($\varphi$_DDS(t)). At 300, a remote local oscillator signal rLO(t) is transmitted from remote station 200 over link 245 and received by frequency tracker 260 of central station 220 at 310. At 320, the frequency of rLO(t) is tracked via frequency tracker 260. At 330, telemetry generator and digital round-trip phase calculator 270 determines a round-trip phase measurement (telemetry+round-trip phase measurements) of the temporal delay variability of the link 245, which is transmitted to central station 220 as a compensating input to the frequency tracker 260. At 340, frequency tracker 260 removes the effect of variable link delay from the measured frequency. In the absence of any phase compensation input at the frequency tracker 260, variation in delay over link 245 modulates the measured frequency, but it is not possible to determine if the modulated frequency is due to a change in frequency of rLO(t) or a delay variation due to the link 245. As an example, if link 245 stretches so that there is a 1 nanosecond delay, if the resulting delay variability is not measured then frequency tracker 260 would detect a decrease in frequency of the extracted signal even though there has been no actual frequency change of rLO(t). Therefore, sending a 1 nanosecond correction (converted to phase at the frequency the frequency tracker 260 is operating at) at 330 will result in frequency tracker 260 being invariant to the 1 nanosecond delay change resulting from variation in the length of the fiber 245.

Digital frequency tracker 260 is an all-digital phase/frequency locked loop where an internal DDS-generated frequency (in the mLO 280 clock domain) is adjusted in phase and frequency, as indicated above, to phase and frequency lock onto the clock derived from the received telemetry data (which tracks rLO 250 since Tx telemetry data at the telemetry generator and digital round-trip phase calculator 270 is clocked by rLO 250).

At 350, any high frequency phase jitter on timescales less than 10× the round-trip signal travel time between the remote station 200 and central station 220 is removed from the phase adjusted tracked frequency via a low-pass filter (LPFF) 290. Therefore, at 340, frequency tracker 260 removes the effect of variable link delay from the measured frequency on timescales>~10× the round-trip delay, and that are within the passband of the LPFF 290.

At 360, the filtered frequency vs. time measurement is converted to a periodically calculated and applied phase increment signal DDS_pinc(t).

At 370, DDS 240 is clocked at a frequency that is phase locked to rLO(t) but adjusted in frequency by the phase increment signal DDS_pinc(t), such that the output frequency of DDS 240 (f_DDS) precisely tracks the master local oscillator signal mLO 280. Clocking of direct digital synthesizer (DDS) 240 by rLO 250 may be done by a direct connection, so as to not introduce undue phase wander of the derived clock $\varphi$_DDS(t) compared to rLO 250.

Then, at 380 a digital to time domain clock converter 295 converts the derived digital domain clock signal $\varphi$_DDS(t) to an ultra-low phase-noise time domain voltage clock signal (i.e. an output jitter-cleaned clock locked to mLO with rLO phase noise over Tau_c uncertainty).

The local oscillator signal from rLO 250 must exhibit no appreciable phase change over a duration of time>~10 times the round-trip delay, which is the round-trip signal travel time between the remote station 200 and the central station 220, plus the delay through LPFF 290 which, as discussed below, is typically the dominant delay. In particular, the rLO 250 must exhibit insignificant high-frequency jitter on time scales Tau<(10× the round trip delay+the LPFF 290 delay) since such is neither measured or corrected by the phase increment "pinc" updates. For example, for a 100 km fiber link, with signal propagation at ⅔c, 10× the round-trip delay is ~10 msec, for a LPFF 290 that filters out jitter on timescales<=this 10 msec (i.e. fc~=¼*0.01 sec=25 Hz) typically has a delay of ~3/fc or 120 msec. Thus, rLO 250 jitter on timescales Tau<130 msec must not be significant.

In embodiments, the phase error measured by the frequency tracker 260, after the LPFF 290, can be measured down to $10^{-6}$ to $10^{-7}$ cycles RMS (or even lower) at a "tracer" frequency (digitally derived from the received rLO 250 data clock) of 10 MHz or higher with no bias (i.e. no drift) between the measured frequency and rLO 250, which is sufficient to determine the required DDS_pinc(t) update values to ensure that the DDS 240 output φ_DDS(t) is phase-locked to mLO 280.

Since f_rLO(t), the frequency at which DDS 240 is clocked, is known (i.e. measured) as well as the resolution nb_DDS of DDS 240, (i.e. the number of bits of DDS 240), pinc can be solved for a desired φ_DDS (t) and output frequency, f_DDS(t)=d(φ_DDS (t))/dt, as follows:

$$f\_DDS = DDS\_pinc(t)/2^{nb\_DDS} \times f\_rLO(t).$$

DDS 240 is driven open-loop (i.e. there is no feedback of φ_DDS (t) to the central station 220), thus there is no remote-to-central station distance limitation due to any such feedback.

It will be appreciated that nb_DDS for DDS 240 must be sufficiently large and DDS_pinc(t) must be calculated to have no bias compared to the frequency vs time measurements by digital frequency tracker 260 since DDS 240 operates open-loop. For example, with nb_DDS=64, and f_r_LO=250 MHz, DDS 240 has a frequency resolution of 250 e6/$2^{64}$=~1 e−11 Hz, but will have no bias with proper digital unbiased rounding methods employed in DDS_pinc calculations.

As discussed above, since clock signal φ_DDS(t) that is tracking mLO 280 is in the digital domain, the digital to time domain clock converter 295 converts φ_DDS(t) to an actual ultra-low phase-noise voltage(t) clock waveform that can be used outside of the digital domain, using any of a number of methods, such as digital phase-to-sine wave conversion, then digital-to-analog conversion, followed by a jitter-cleaning circuit.

In summary, as set forth herein, an ultra-low phase noise remote clock is output from the digital to time domain clock converter 295 that is phase-locked to master local oscillator mLO 280 for use, as an example, in heterodyne receivers up to 1 THz and digitizers up to 100 GHz, with virtually no limitations in the distance between the remote station 200 and the central station 220, the only limitation being the frequency stability of rLO 250, which, as discussed above, must remain stable as previously described as the distance increases. Distributed incoherent clocking module 230 transfers time measurements to the remote station 200 rather than re-sampling digitized data, as in the prior art. Round-trip phase vs. time measurements are performed instead of feedback, to remove effects of any central-to-remote station link instabilities, thereby allowing clock and time transfer over large distances.

It is contemplated that very long-range ultra-low phase noise time (clock) transfer may be possible over bi-directional fiber or wireless connections in radio telescopes, limited only by the stability of rLO 250.

The present invention has been described above with reference to a number of exemplary embodiments and examples. It should be appreciated that the particular embodiments shown and described herein are illustrative of the invention and its best mode and are not intended to limit in any way the scope of the invention as set forth in the claims. The features of the various embodiments may stand alone or be combined in any combination. Further, unless otherwise noted, various illustrated steps of a method can be performed sequentially or at the same time, and not necessarily be performed in the order illustrated. It will be recognized that changes and modifications may be made to the exemplary embodiments without departing from the scope of the present invention. These and other changes or modifications are intended to be included within the scope of the present invention, as expressed in the following claims.

The invention claimed is:

1. A system for synchronizing at least one remote station with a central station over a duplex real-time link, comprising:
   a distributed incoherent clocking module for receiving a remote local oscillator signal from at least one remote station and a master local oscillator signal from the central station and in response to:
      determining a round-trip phase measurement of temporal delay variability of the duplex real-time link between the remote station and central station,
      measuring frequency vs. time of the remote local oscillator signal relative to the master oscillator signal,
      adjusting the measured frequency vs. time according to the round-trip phase measurement to remove effects of temporal delay variability over the duplex real-time link telemetry, and
      generating a phase increment signal;
   a direct digital synthesizer for receiving and phase adjusting the local oscillator signal according to the phase increment signal and in response generating a derived digital domain clock signal that tracks the master local oscillator signal; and
   a digital to time domain clock converter for converting the derived digital domain clock signal to an ultra-low phase-noise time domain voltage clock signal.

2. The system of claim 1, wherein the distributed incoherent clocking module further comprises:
   a telemetry generator and digital round-trip phase calculator for measuring phase vs. time of the remote local oscillator signal relative to the master local oscillator signal to determine the round-trip phase measurement; and
   a digital frequency tracker for measuring the frequency vs. time of the remote local oscillator signal relative to the master oscillator signal, adjusting the measured frequency vs. time according to the round-trip phase measurement, and generating a periodically calculated and applied phase increment signal.

3. The system of claim 2, further comprising a low pass filter for removing remote-to-central station link phase perturbations incident on the digital frequency tracker.

4. The system of claim 2, wherein the digital frequency tracker comprises an all-digital phase/frequency locked loop for adjusting phase and frequency of an internally generated clock signal derived from the master local oscillator signal to phase and frequency lock onto the remote local oscillator signal.

5. The system of claim 4, wherein the duplex real-time link is wireless.

6. The system of claim 4, wherein the duplex real-time link comprises digital fiber optics.

7. The system of claim 1, wherein the distributed incoherent clocking module generates the phase increment signal, pinc, for a given output frequency, f_DDS, of the derived digital domain clock signal, φ_DDS(t), output from the direct digital synthesizer, based on the frequency, f_rLO (t), at which the direct digital synthesizer is clocked and number of bits, nb_DDS of the direct digital synthesizer, as follows:

$$f\_DDS = DDS\_pinc(t)/2^{nb\_DDS} \times f\_rLO(t).$$

8. A method of synchronizing at least one remote station with a central station over a duplex real-time link, comprising:
   transmitting a remote local oscillator signal from the remote station over the duplex real-time link;
   receiving the remote oscillator signal from the duplex real-time link at the central station;
   measuring frequency vs. time of the remote local oscillator signal relative to a central oscillator signal at the central station;
   determining a round-trip phase measurement of temporal delay variability of the duplex real-time link between the remote station and central station;
   adjusting the tracked frequency of the remote local oscillator signal according to the round-trip phase measurement to remove effects of temporal delay variability over the duplex real-time link;
   low-pass filtering frequency jitter from the tracked frequency on timescales less than 10× the round-trip delay over the link;
   converting the low-pass filtered tracked frequency vs. time measurements to a periodically calculated and applied phase increment signal;
   clocking a direct digital synthesizer at remote station with the remote local oscillator signal phase adjusted by the periodically calculated and applied phase increment to generate a derived digital domain clock signal; and
   converting the derived digital domain clock signal to an ultra-low phase-noise time domain voltage clock signal.

9. The method of claim 8, wherein the duplex real-time link is wireless.

10. The method of claim 8, wherein the duplex real-time link comprises digital fiber optics.

11. The method of claim 8, wherein the periodically calculated and applied phase increment, pinc, is generated for a given output frequency, f_DDS, of the derived digital domain clock signal, φ_DDS(t), based on a frequency, f_rLO(t), of the remote local oscillator signal and number of bits, nb_DDS of the derived digital domain clock signal, φ_DDS(t), as follows:

$$f\_DDS = DDS\_pinc(t)/2^{nb\_DDS} \times f\_rLO(t).$$

12. A digital logic device comprising a plurality of logic gates configured to perform logic functions according to the method steps of claim 8.

* * * * *